United States Patent [19]

Gipstein et al.

[11] 4,011,351

[45] Mar. 8, 1977

[54] PREPARATION OF RESIST IMAGE WITH METHACRYLATE POLYMERS

[75] Inventors: Edward Gipstein, Saratoga, Calif.; Wayne M. Moreau, Wappingers Falls, N.Y.; Omar U. Need, III, San Jose, Calif.

[73] Assignee: International Business Machines Corporation, Armonk, N.Y.

[22] Filed: Jan. 29, 1975

[21] Appl. No.: 545,063

[52] U.S. Cl. .................................. 427/43; 96/35.1; 96/115 R; 204/159; 204/14; 427/44

[51] Int. Cl.² .......................... B05D 3/06; G03C 5/00

[58] Field of Search .......... 96/35.1, 115 R; 427/43, 427/44; 204/159, 14

[56] References Cited

UNITED STATES PATENTS

| | | | |
|---|---|---|---|
| 2,905,556 | 9/1959 | Fuchsman et al. | 96/115 R |
| 3,535,137 | 10/1970 | Haller et al. | 427/44 |
| 3,679,497 | 7/1972 | Handy et al. | 427/43 |
| 3,770,433 | 11/1973 | Bartelt et al. | 96/35.1 |
| 3,779,806 | 12/1973 | Gipstein et al. | 427/44 |
| 3,898,350 | 8/1975 | Gipstein et al. | 427/43 |

OTHER PUBLICATIONS

Harris, Journal of Electro–Chemical Soc. vol. 120, No. 2, pp. 270–274.

*Primary Examiner*—Jack P. Brammer
*Attorney, Agent, or Firm*—Pollock, Vande Sande & Priddy

[57] ABSTRACT

A positive resist image is produced by exposure of a layer of non-crosslinked polymeric material to high energy radiation in a predetermined pattern, the polymeric material containing alkyl methacrylate units and polymerized units of certain other ethylenically unsaturated monomers, followed by removal of the electron degraded material from the exposed areas.

15 Claims, No Drawings

PREPARATION OF RESIST IMAGE WITH METHACRYLATE POLYMERS

BACKGROUND OF THE INVENTION

The use of certain alkyl methacrylate polymers as electron beam degradable polymers for the formation of resist masks which are useful in the fabrication of integrated circuits, printing plates and the like has been proposed heretofore. For instance, U.S. Pat. No. 3,535,137 granted on Oct. 20, 1970 to Haller et al. teaches among other things the use of methacrylate polymers containing a quaternary carbon in the polymer backbone such as polymethyl methacrylate, and copolymers of methyl methacrylate with 2-hydroxy ethyl methacrylate, for such purpose. In addition, U.S. Pat. No. 3,779,806 granted on Dec. 19, 1973 to Gipstein et al. discloses the use of certain polymers of t-butyl methacrylate for such purpose. Related discussions are contained in the articles "Polymethyl Methacrylate as an Electron Sensitive Resist" by R. A. Harris, J. Electrochemical Society, Vol, 120, No. 2, pp. 270-274, Feb. 1973, and "A Modified Methacrylate Positive Electron Resist" by E. D. Roberts, Applied Polymer Symposium No. 23, pp. 87-98 (1974).

Generally the resist masks are prepared by coating a film on layer of the polymeric material on a substrate, and then exposing portions of the film or layer to an electron beam in a predetermined pattern of the desired mask with sufficient exposure to degrade the polymeric material in the exposed areas. Next, the electron beam degraded polymeric material is removed from the exposed area with a solvent which has a marked differential solubility for the degraded products and for the unexposed polymeric material.

In the manufacturing of such devices as integrated circuits by electron beam lithography, it is important that the energy dosage and exposure time required to sufficiently degrade the exposed pattern of the polymeric material for high resolution be as low as possible to provide a process which is both practical and economical to carry out.

Accordingly, it is an object of the present invention to provide a process for forming a positive resist image by exposure to electron beams wherein the polymeric material employed has improved resist sensitivity and resolution.

Another object of the present invention is to provide a process for the formation of high resolution polymeric positive resists utilizing an electron beam activated polymer of certain polymeric materials containing alkyl methacrylate units, which polymer exhibits excellent film-forming characteristics, differential solubility in solvents between exposed and unexposed areas, resistance to various etch solutions, and ready removal of unexposed portions with simple solvents.

The use of polymethyl methacrylate suggested heretofore has apparently been limited to techniques in semiconductor processing which employs temperature not exceeding about 135° C (see M. Hatzakis, Journal Electrochemical Society, 116, 1033, 1969). Accordingly, it is an object of the present invention to provide a process wherein at least some of the polymeric materials employed has increased thermostability as compared to polymethyl methacrylate homopolymers. The present invention makes it possible in certain instances to provide semiconductor processing such as sputter etching, ion-beam etching, ion-beam doping, or lift off metallurgy techniques wherein the polymeric material can be subjected to relatively high temperatures (i.e., above about 135° C).

SUMMARY OF THE INVENTION

The present invention is concerned with a method for the production of a positive resist image comprising the steps of:

A. exposing a film of a non-crosslinked polymeric material to electron beam radiation in a predetermined pattern, wherein the polymeric material is a:
  1. polymeric material containing:
     a. polymerized alkyl methacrylate units wherein the alkyl group contains from 1 to 4 carbon atoms; and
     b. polymerized units of at least one other ethylenically unsaturated monomer containing halogen substituted and/or cyano substituent; and
  wherein the amount of the alkyl methacrylate units (a) is from about 50 to about 99 mole % and the amount of the at least one other ethylenically unsaturated monomer units (b) is from about 50 to about 1 mole % based upon the total moles of (a) and (b) in the polymeric material; and/or
  2. posthalogenated polymers of the above polymeric material (1) wherein the halogen content due to the posthalogenation is from about 1 to about 10 mole %, and wherein the total halogen content and cyano content is from about 2 to about 50 mole %; and/or
  3. posthalogenated polyalkyl methacrylate wherein the alkyl group contains from 1 to 4 carbon atoms and wherein the halogen content is between about 1 and about 10 mole %;
B. continuing said exposure until substantial degradation of said polymeric material to lower molecular weight products is achieved in the exposed areas; and
C. removing the degraded products in the exposed areas.

DESCRIPTION OF PREFERRED EMBODIMENTS

One type of polymeric material which can be employed according to the present invention is a non-crosslinked polymeric material which contains polymerized alkyl methacrylate units wherein the alkyl group contains from 1 to 4 carbon atoms; and polymerized units of at least one other ethylenically unsaturated monomer containing halogen substituent and/or cyano substituent.

Exemplary of suitable alkyl methacrylate units in the polymeric material are methyl methacrylate, and t-butyl methacrylate of which methyl methacrylate is preferred. Mixtures of the alkyl acrylate can be employed if desired.

The units from the other ethylenically unsaturated monomer are from monomers which are more electron withdrawing than the alkyl methacrylate employed and preferably include at least one Cl, Br, I, or CN substituent. These units can include more than one of the halogen and cyano substituents when desired. Moreover, mixtures of the units from the other ethylenically unsaturated monomers can be employed.

Exemplary of some suitable polymerized units of these latter discussed monomeric materials have the following formula:

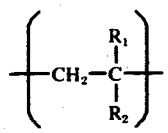

wherein $R_1$ is selected from the group consisting of H, $CH_3$, CN, Cl, $CH_2Cl$, $CH_2CN$, Br, $CH_2Br$, I, $CH_2I$, and F and wherein $R_2$ is selected from the group of $COOCH_3$, COOH, CN, $CH_2CN$, Cl, $CH_2Cl$, Br, $CH_2Br$, I, $CH_2I$, and F, provided that when $R_2$ is $COOCH_3$ or COOH then $R_1$ is other than $CH_3$ and H.

Some specific examples of these monomeric materials are methyl-α-cyano acrylate, methyl-α-cyano methyl acrylate, methyl-α-chloro acrylate, methyl-α-chloro methyl acrylate, α-chloro acrylonitrile, α-chloro acrylic acid, methyl-α-bromo acrylate, methyl-α-bromo methyl acrylate, vinyl chloride, and vinylidene chloride. The preferred monomeric units are from methyl-α-cyano acrylate, methyl-α-chloro acrylate, α-chloro acrylonitrile, and methyl-α-bromo acrylate.

The above polymeric materials can be random copolymers, graft copolymers, block copolymers, or compatible (i.e., homogeneous) mixtures of homopolymers or mixtures of any of the above when compatible. Generally the relative amount of the polymerized alkyl methacrylate units in the above polymeric material is from about 50 to about 99 mole % and the relative amount of the polymerized units from the other ethylenically unsaturated monomer is from about 50 to about 1 mole % based upon the total moles of the alkyl methacrylate units and the at least one other ethylenically unsaturated monomer units.

Preferably the polymeric material contains from about 95 to about 50 mole % of the polymerized alkyl methacrylate units and most preferably from about 90 to about 60 mole % based upon the total moles of alkyl methacrylate units and units from the other ethylenically unsaturated monomer.

Preferably the polymeric material contains polymerized units of the other ethylenically unsaturated monomer in amounts from about 5 to about 50 mole %, and most preferably in amounts from about 10 to about 40 mole % based upon the total moles of the aklyl methacrylate and other ethylenically unsaturated monomer in the polymeric material. If desired, the polymeric material can contain minor amounts (i.e., up to about 10 mole %) of polymerized units of ethylenically unsaturated monomers other than those discussed above (i.e., methacrylic acid, acrylic acid, and crotonic acid) so long as such do not adversely affect the electron beam sensitivity of the polymeric material or form insoluble residues in the exposed polymer such as by crosslinking and so long as the total amount of units of ethylenically unsaturated monomers other than the alkyl methacrylate units is no greater than about 50 mole % of the polymeric material.

When employing mixtures of polymers, the mixtures usually contain from about 99 to about 90 mole % of the alkyl methacrylate units and preferably from about 97 to about 92 mole %, based upon the total moles of alkyl methacrylate units and other ethylenically unsaturated units in the polymer material since the polymers of the alkyl methacrylates and particularly homopolymers such as polymethyl methacrylate are not very compatible with polymembers of the other ethylenically unsaturated monomers. Generally, homogeneous blends of polymers can be most successfully obtained when the other ethylenically unsaturated monomer contains a halogen group such as chlorine, bromine, or iodine. But even then, the amount of such polymers of the other said monomers which can be employed to provide a homogeneous mixture with the polyalkyl methacrylate, is limited. Generally when homogeneous blends of polymers are to be employed as the polymeric material, polymers from the ethylenically unsaturated monomer other than the alkyl methacrylate are present in amounts from about 1 to about 10 mole % and preferably from about 3 to about 8 mole % based upon the total moles of alkyl methacrylate units and units from the other ethylenically unsaturated monomer.

Of the above-discussed polymeric materials, the random copolymers are preferred.

Another type of polymeric material which can be employed according to the present invention is posthalogenated polymers of the above-discussed polymeric materials which contain the alkyl methacrylate units and the units of at least one other ethylenically unsaturated monomer.

Still another type of polymeric material which can be employed according to the present invention is posthalogenated polymers of alkyl methacrylate. These polymers of alkyl methacrylates which can be halogenated to provide materials suitable for the present invention include homopolymers of alkyl methacrylates wherein the alkyl group contains from 1 to 4 carbon atoms such as polymethyl methacrylate and poly-t-butyl methacrylate, and copolymers of alkyl methacrylates wherein the alkyl group contains from 1 to 4 carbon atoms such as copolymers of methyl methacrylate and tert-butyl methacrylate.

Posthalogenation refers to halogenation after the polymerization of the monomers. Generally the halogenated polymers are chlorinated and/or brominated and/or iodinated, and preferably are chlorinated. The halogen content of the posthalogenated polymers due to the posthalogenation is from about 1 to about 10 mole %, and preferably from about 3 to about 8 mole % based upon the moles of polymer.

The total of the halogen content and cyano content of posthalogenated polymer materials containing the units of the ethylenically unsaturated monomers other than the alkyl methacrylate is from about 2 to about 50 mole %.

Generally the polymer materials employed according to the present invention have a number average molecular weight ($\overline{Mn}$) in the range of about $5 \times 10^3$ to about $1500 \times 10^3$ and preferably in the range of about $20 \times 10^3$ to about $1,000 \times 10^3$ and have a weight average molecular ($\overline{Mw}$) in the range of about $10 \times 10^3$ to about $3000 \times 10^3$ and preferably in the range of about $40 \times 10^3$ to about $200 \times 10^3$.

One method for preparing copolymers employed in the present invention is by solution polymerization employing a free radical initiator. Exemplary of diluents for the solution polymerization are the aromatic hydrocarbons such as benzene, toluene, and xylene, ethers such as cellosolve ether, dioxane, and tetrahydrofuran, and ketones such as methyl ethyl ketone. Free radical catalysts or initiators of particular interest include azo type catalysts such as azobisisobutyronitrile and peroxide catalysts. Some examples of suitable peroxide catalysts include hydrogen peroxide, benzoyl peroxide, tert-butyl peroctoate, phthalic peroxide, succinic peroxide, benzoyl acetic peroxide, coconut oil acid peroxide, lauric peroxide, stearic peroxide, oleic peroxide, tert-butyl hydroperoxide, tetraline hydroperoxide, tert-butyl diperphthalate, cumene hydroperoxide, tert-butyl perbenzoate, acetyl peroxide, 2,4-dichlorobenzoyl peroxide, urea peroxide, caprylyl peroxide, p-chlorobenzoyl peroxide, di-tert butyl peroxide, 2,2-bis-(tert-butyl peroxy)-butane, hydroxyheptyl peroxide, the diperoxide of benzaldehyde, and the like.

The amount of diluent employed depends upon the particular diluent and particular monomers used and is usually from about 99 parts to about 2.5 parts and preferably from about 70 parts to about 10 parts per part of polymerizable monomer.

The amount of catalyst employed depends upon the type of catalyst system used and is generally from about 0.01 to about 10 parts by weight per 100 parts of the polymerizable monomers, and preferably is from about 0.1 to about 1 part by weight per 100 parts of the polymerizable monomers.

The polymerization is generally carried out at temperatures between about room temperature and about 150° C, and preferably between about 50° C and about 100° C. Usually the polymerization is conducted under autogenous pressure in a closed reaction vessel. However, any suitable means to prevent significant evaporation of any of the monomers can be employed.

Generally the polymerization is completed in about 4 to about 36 hours and preferably is completed in about 6 to 24 hours. It is understood, of course, that the time and temperature are inversely related. That is, temperatures employed at the upper end of the temperature range will provide polymerization processes which can be completed near the lower end of the time range.

The posthalogenated polymeric materials can be prepared by bubbling a halogen such as chlorine gas through a solution of the polymeric material and employing a photochemical reactor. In order to prevent excessive degradation of the polymer during the halogenation, it is preferred to place the photochemical lamp of the reactor inside a Pyrex glass sleeve to permit the passage of only visible light.

The polymeric materials employed in the present invention are normally coated on a substrate from a solution of the polymeric material in any suitable manner such as by spin casting or dipping, and then dried to remove the volatile matter. The solution of the polymeric material should be compatible with the substrate. The solvents employed should having boiling points below the decomposition point of the polymeric material employed in order to permit removal of the solvent from the cast film by heating. Exemplary of some suitable solvents are nitromethane and dioxane for copolymers of methyl methacrylate and methyl-$\alpha$-chloro acrylate; 1,2-dichloroethane and tetrahydrofuran for copolymers of methyl methacrylate and methyl-$\alpha$-chloro acrylate; 1,3-dichloropropane for copolymers of methyl methacrylate and methyl-$\alpha$-bromo-acrylate; 1,3-dichloropropane for copolymers of methyl methacrylate and $\alpha$-chloro acrylate; and methyl ethyl ketone for post chlorinated polymethyl methacrylate.

The determination of a specific solvent system for a particular polymeric material primarily depends upon the chemical identity of the polymeric material and upon the molecular weight and is readily ascertainable.

The polymeric films can be cast in various thicknesses and particularly from about 50 angstroms to about 10 microns. The particular thickness will depend upon the type of processing to be employed. For instance, 0.5 to 2 microns is generally desirable for etch processing whereas from about 1.5 to about 3 microns is generally used for lift off metallurgical processing.

In addition, it is preferred to prebake the polymeric material film in air or in vacuum at a temperature generally above the glass transition temperature of the polymeric material but below the thermal decomposition temperature of the polymeric material. The prebaking step is intended to remove trace amounts of the solvent employed in the coating step and also to anneal out strains in the polymeric film. Some exemplary prebake temperatures are about 100° to about 180° C for copolymers of methyl methacrylate and methyl-$\alpha$-cyano acrylate; from about 85 to about 135° C for copolymers of methyl methacrylate and methyl-$\alpha$-chloro acrylate; from about 100° to about 150° C for chlorinated polymethyl methacrylate; from about 100° to about 150° C to for copolymers of methyl methacrylate and methyl-$\alpha$-chloro acrylate; and from about 75° to about 125° C for copolymers of methyl methacrylate and methyl-$\alpha$-bromo acrylate.

Various substrates can be employed as supports for the polymer resist of the present invention. For instance, in application of the polymer resist in the fabrication of semiconductor devices, or integrated circuits, the substrate can comprise semiconductor wafers or chips overcoated with oxides and nitrides such as silicon oxide/silicon nitride for diffusion masks and passivation, and/or metals normally employed in the metallization steps for formng contacts and conductor patterns on the semiconductor chip.

After the polymeric film is dried, it is exposed to a pattern degrading electron beam radiation to delineate the necessary pattern required in the processing such as in integrated circuits. The enhanced sensitivity of the polymeric materials in conjunction with the appropriate developers render such particularly useful for a process employing a low energy electron beam radiation. The specific exposure flux will normally be dependent upon the particular polymeric material selected and upon the thicknesses of the polymeric resist. Generally for exposure of the polymer material in thicknesses of about 50 angstroms to about 10 microns, electron beam radiation from $10^{-6}$ coulombs/cm$^2$ to about $10^{-3}$ coulombs/cm$^2$ and preferably from about $10^{-5}$ to about $10^{-6}$ coulombs/cm$^2$; and at an accelerating potential in the range from about 1 to about 50 kv and preferably from about 10 to 30 kv are employed.

After exposure, the exposed portions of the polymeric film (the degraded products of lower molecular weight) are removed with a suitable solvent which has a markedly lower solubility for the unexposed areas of the polymer resist. The present invention provides greater degradation of the polymer chain by exposure than is achieved with homopolymers of polyalkyl methacrylates such as polymethyl methacrylate.

The exposed portions are generally removed with the solvent at temperatures in the range of from about 10° C to about 100° C. Generally, the development time ranges from about 1 to about 60 minutes and preferably between about 5 and 15 minutes. Of course, the development time can be altered by such factors as the particular polymeric material employed, the thickness of the film, the particular solvent system employed, and the particular temperature employed for the development step.

Various types of solvent systems or developing processes can be used. For instance, a solvent system which is a good solvent for both the exposed and unexposed polymer can be employed when particularly fast processes are desirable. In such a system, the thickness of the polymeric material is adjusted so that the remaining unexposed film is thick enough to protect the substrate during subsequent treatment.

Also, if desired, a solvent system which is only a solvent for the exposed areas can be used in the development. Another means of development is to employ a mixture of a solvent capable of dissolving the polymeric material regardless of its molecular weight and a liquid which is incapable of dissolving the polymeric material regardless of its molecular weight in proportions sufficient to dissolve only the exposed portions.

Some examples of suitable solvent developers include alcohols such as ethyl alcohol, water, cellosolve, acetates, ketones, chlorinated alkanes, and mixtures which would be selected depending upon the particular polymeric system employed such as the chemical identity of the polymeric material and its molecular weight. Exemplary of some suitable solvent developers are 1,4-dichlorobutane, nitropentane and cycloheptanone for copolymers of methyl methacrylate and methyl-$\alpha$-cyano acrylate; methyl ethyl ketone, nitropropane and cyclohexanone for copolymers of methyl methacrylate and methyl-$\alpha$-chloro acrylate; cyclopentanone, cycloheptanone, and hexyl acetate for copolymers of methyl methacrylate and methyl-$\alpha$-chloromethyl acrylate; mixtures of chloroform and cyclohexane, and 1,6-dichlorohexane for copolymers of methyl methacrylate and methyl-$\alpha$-bromo acrylate; and hexyl acetate and methyl butyl ketone for chlorinated polymethyl methacrylate.

The pattern resist image can be postbaked to remove the developer solvents. Normally the temperatures used should be below the melting point or flow point of the polymeric film. Generally the temperature for postbaking is from about 100° to about 200° C depending upon the particular polymeric material employed. In contrast, when using prior art polymethyl methacrylate, only temperatures up to 135° C can be employed. The increased thermostability achieved by the present invention in certain instances is useful in lift off metallurgical processing in which the metal is preferentially deposited at elevated temperatures.

In the lift-off process, the resist acts as a deposition mask for the metal overlay. If polymethyl methacrylate is employed as the resist, the substrate such as a silicon wafer must be cooled to prevent heating the resist above temperatures of about 100° C. If the substrate temperature rises above 100° C, the resist film tends to collapse and the images will close shut. Since metal films such as aluminum are deposited from vapor at a temperature of about 400° C, large grains in the metal film can be formed by growth on a cooled substrate. This large gradient from vapor to solid film induces localized defects and electrical failure. On the other hand, when certain of the polymeric materials of the present invention are employed, it is possible to utilize smaller temperature gradients thereby improving the deposition of the metal by reducing the grain size.

The resist films can then be solvent stripped from the substrate following the etch, or the undesired metal can be lifted off in the so-called "lift-off" process.

Suitable stripping solvents are the casting film solvents employed at elevated temperatures such as for example cellosolves, acetates, formamides, dioxane, and chlorinated solvents. Such, of course, depend upon the particular polymeric materials employed. Exemplary of some suitable stripping solvents are dioxane at about 45° C for copolymers of methyl methacrylate and methyl-$\alpha$-cyano acrylate and for copolymers of methyl methacrylate and methyl-$\alpha$-chloro acrylate; nitromethane at about 45° C for copolymers of methyl methacrylate and methyl-$\alpha$-chloro acrylate 1,2-dichloroethane for copolymers of methyl methacrylate and methyl-$\alpha$-bromo acrylate at room temperature; and chloroform at about 45° C for chlorinated polymethyl methacrylate.

The following nonlimiting examples are provided to further demonstrate the present invention.

EXAMPLE A

Copolymer of 60 Mole % Methyl Methacrylate and 40 Mole % of Methyl-$\alpha$-Chloro Acrylate 10 grams of methyl methacrylate and 12 grams of methyl-$\alpha$-chloro acrylate are dissolved in 100 ml of dry toluene in a pressure bottle. About 27 mg of azobisisobutyronitrile are then added. The pressure bottle is then capped and heated to 70° C for about 20 hours.

The polymer is then precipitated out of solution by admixing the polymerization solution with methyl alcohol. The precipitated polymeric material is then dissolved in nitromethane and reprecipitated in methyl alcohol. Next the polymer is vacuum dried at about $10^{-3}$ mm of pressure at a temperature of about 50°–60° C to thereby provide about 10.5 grams of polymer. Elemental analysis of the copolymer demonstrates that it is a copolymer of 60 mole % methyl methacrylate and 40 mole % methyl-$\alpha$-chloro acrylate and is as follows:

|  | Found | Calculated |
| --- | --- | --- |
| C | 52.10 | 51.93 |
| H | 6.74 | 6.51 |
| Cl | 12.86 | 11.76 |
| O | 27.78 | 28.18 |

The polymer has a $\overline{M_w}$ of about $240 \times 10^3$.

EXAMPLE B

Copolymer of 50 Mole % Methyl Methacrylate and 50 Mole % $\alpha$-Chloroacrylonitrile 10 grams of methyl methacrylate and about 8.8 grams of $\alpha$-chloroacrylonitrile are dissolved in 100 mls of dry toluene in a pressure bottle. About 27 mg of azobisisobutyronitrile are then added to the pressure bottle. The pressure bottle is then capped and heated to 70° C for about 20 hours. The polymer is then precipitated out of solution by admixing the polymerization solution with methyl alcohol. The precipitated polymeric material is then dissolved in nitromethane and reprecipitated in methyl alcohol.

Next the polymer is vacuum dried at about $10^{-3}$ mm of pressure at a temperature of about 50°–60° C to thereby provide about 1.3 grams of polymer. Elemental analysis of the copolymer demonstrates that it is a copolymer of about 50 mole % methyl methacrylate and about 50 mole % of chloroacrylonitrile and is as follows:

|   | Found | Calculated |
|---|-------|------------|
| C | 50.37 | 50.58 |
| H | 5.06 | 5.18 |
| Cl | 20.37 | 20.26 |
| O | 15.00 | 15.98 |
| N | 8.70 | 8.01 |

The polymer has an average molecular weight as determined by viscosity measurements of about $104 \times 10^3$.

EXAMPLE C

Copolymer of 85 Mole % Methyl Methacrylate and 15 Mole % of Methyl-α-Bromoacrylate 6 grams of methyl methacrylate and 1.8 grams of methyl-α-bromo acrylate are dissolved in 100 mls of dry toluene in a pressure bottle. About 27 mgs of azobisisobutyronitrile are then added to the pressure bottle. The pressure bottle is then capped and heated to 70° C for about 20 hours. The polymer is then precipitated out of solution by admixing the polymerization solution with methyl alcohol. The precipitated polymeric material is then dissolved in nitromethane and reprecipitated in methyl alcohol. Next the polymer is vacuum dried at about $10^{-3}$ mm of pressure and a temperature of about 50°-60° C. The polymer has an average molecular weight as determined by viscosity measurement of about $54 \times 10^3$.

Elemental analysis of the copolymer demonstrates that it is a copolymer of about 85 mole % methyl methacrylate and about 15 mole % of methyl-α-bromo acrylate.

EXAMPLE D

Post Chlorinated Polymethyl Methacrylate

Twenty grams of polymethyl methacrylate having a $\overline{Mw}$ of $450 \times 10^3$ and a $\overline{Mn}$ of $120 \times 10^3$ and 0.8 g naphthalene are dissolved in a mixture of 300 ml benzene and 300 ml carbon tetrachloride in a 1 l photochemical reactor equipped with magnetic stirrer, condenser, thermometer and gas-inlet tube extending below the surface of the liquid. The mixture is then flushed with nitrogen for about 30 minutes. Next chlorine gas is bubbled through the mixture for 1 hour.

The mixture during this time is illuminated with a 450 watt photochemical lamp placed inside a pyrex glass sleeve to permit the passage of only visible light. The polymer is then precipitated in methyl alcohol followed by vacuum drying at about $10^{-3}$ mm of pressure at about 50°-60° C. About 18.5 grams of a polymer of $\overline{Mw}$ $238 \times 10^3$ and $\overline{Mn}$ of $147 \times 10^3$ are recovered. The chlorine content of the polymer is determined to be about 3.9 mole %.

EXAMPLE E

Copolymer of 92 Mole % Methyl Methacrylate and 8 Mole % Methyl-α-Cyano Acrylate 0.059 moles of methyl methacrylate and 0.005 moles of methyl-α-cyano acrylate are dissolved in 100 ml of dry toluene in a pressure bottle. About 27 mg of azobisisobutyronitrile are then added. The pressure bottle is then capped and heated to 70° C for about 20 hours. The polymer is then precipitated out of solution by admixing the polymerization solution with methyl alcohol. The precipitated polymeric material is then dissolved in nitromethane and reprecipitated in methyl alcohol. Next the polymer is vacuum dried at about $10^{-3}$ mm of pressure at a temperature of about 50°-60° C to thereby provide the polymer at a conversion of about 63%. Elemental analysis of the copolymer demonstrates that it is a copolymer of about 92 mole % methyl methacrylate and about 8 mole % methyl-α-cyano acrylate. The polymer has $\overline{Mw}$ of about $88 \times 10^3$ and $\overline{Mn}$ of about $29 \times 10^3$.

EXAMPLE F

Copolymer of 76 Mole % Methyl Methacrylate and 24 Mole % Methyl-α-Cyano Acrylate 0.085 moles of methyl methacrylate and 0.015 moles of methyl-α-cyano acrylate are dissolved in 100 ml of dry toluene in a pressure bottle. About 27 mg of azobisisobutyronitrile are then added. The pressure bottle is then capped and heated to 70° C for about 20 hours. The polymer is then precipitated out of solution by admixing the polymerization solution with methyl alcohol. The precipitated polymeric material is then dissolved in nitromethane and reprecipitated in methyl alcohol. Next the polymer is vacuum dried at about $10^{-3}$ mm of pressure at a temperature of about 50°-60° C to thereby provide the polymer at a conversion of about 64%. Elemental analysis of the copolymer demonstrates that it is a copolymer of about 76 mole % methyl methacrylate and about 24 mole % methyl-α-cyano acrylate. The polymer has a $\overline{Mw}$ of about $568 \times 10^3$ and $\overline{Mn}$ of about $63 \times 10^3$.

EXAMPLE 1

About a 10 weight % solution of a copolymer of 76 mole % methyl methacrylate and 24 mole % methyl-α-cyano acrylate prepared in accordance with Example F, and having a $\overline{Mw}$ of about $568 \times 10^3$ and $\overline{Mn}$ of about $63 \times 10^3$ and a thermal stability of about 175° C in nitropentane is obtained. A film of about 7540 A of the copolymer on 5000 A substrate of thermal oxide of silicon is obtained by spin casting the copolymer solution at 3000 rpm. The film is then prebaked at about 160° C for about 1 hour on a hot plate. The film is then exposed in vacuum with a 0.5 μ diameter electron beam to a dose of $7.9 \times 10^{-6}$ c/cm² at 25 kv. The film is developed in 1,4-dichlorobutane at 25° C for 18 minutes. The exposed region is removed by the solvent yielding a positive image. The net film thickness remaining in the unexposed region is about 65% of the original thickness. The sample is rinsed in chloroform and dried at 110° C for 20 minutes. The 5000 A oxide layer is etched with buffered HF at 21° C to yield 0.5 μ images for diffusion doping. The film is stripped in five minutes in dioxane at 45° C followed by a water rinse and oven drying.

EXAMPLE 2

About a 10 weight % solution of a copolymer of 60 mole % methyl methacrylate and 40 mole % of methyl-α-chloro acrylate prepared in accordance with Example A, and having a thermal stability of about 120° C and having a $\overline{Mw}$ of about $240 \times 10^3$ in 1,2-dichloroethane is obtained. A film of about 6545 A of the copolymer on 5000 A substrate of thermal oxide of silicon is obtained by spin casting the copolymer solution at 3000 rpm. The film is then prebaked at about 125° C for about 1 hour on a hot plate. The film is then exposed in vacuum with a 0.5 μ diameter electron beam to a dose of $8.2\times10^{-6}$ coulombs/cm$^2$ at 25 kv. The film is then developed in a methyl ethyl ketone at 31° C for 13 minutes. The exposed region is removed by the solvent yielding a positive image. The net film thickness remaining in the unexposed region is about 58% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in dioxane at 45° C followed by a water rinse and oven drying.

EXAMPLE 3

About a 10 weight % solution of a copolymer of 50 mole % methyl methacrylate and 50 mole % $\alpha$-chloroacrylonitrile prepared in accordance with Example B and having a thermal stability of about 120° C and a molecular weight of $104\times10^3$ in 1,3-dichloropropane is obtained. A film of about 8950 A of the copolymer on 5000 A substrate of thermal oxide of silicon is obtained by spin casting the copolymer solution at 3000 rpm. The film is then prebaked at about 120° C for about 1 hour on a hot plate. The film is then exposed in vacuum with a 0.5 $\mu$ diameter electron beam to a dose of $7.1\times10^{-6}$ coulombs/cm$^2$ at 25 kv. The film is then developed in cyclopentanone at 20° C for 6.5 minutes. The exposed region is removed by the solvent yielding a positive image. The net film thickness remaining in the unexposed region is about 72% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in dioxane at 45° C followed by a water rinse and oven drying.

EXAMPLE 4

About a 10 weight % solution of a copolymer of 85 mole % methyl methacrylate and 15 mole % methyl-$\alpha$-bromo acrylate prepared in accordance with Example A and having a thermal stability of about 100° C and a molecular weight of about $54\times10^3$ in 1,3dichloropropane is obtained. A film of about 7950 A of the copolymer on 5000 A substrate of thermal oxide of silicon is obtained by spin casting the copolymer solution at 3000 rpm. The film is then prebaked at about 100° C for about 1 hour on a hot plate. The film is then exposed in vacuum with a 0.5 $\mu$ diameter electron beam to a dose of $6.8\times10^{-6}$ coulombs/cm$^2$ at 25 kv. The film is then developed in a mixture of 1 part of chloroform per 2 parts of cyclohexane at 22° C for 3 minutes. The exposed region is removed by the solvent yielding a positive image. The net film thickness remaining in the unexposed region is about 63% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in 1,2-dichloroethane at room temperature followed by a water rinse and oven drying.

EXAMPLE 5

About a 10 weight % solution of a post chlorinated polymethyl methacrylate of chlorine content of about 3.9 mole %, a $\overline{Mw}$ of $238\times10^3$, a $\overline{Mn}$ of about $147\times10^3$ and a thermal stability of about 135° C and prepared in accordance with Example D in methyl ethyl ketone is obtained. A film of about 6850 A of the polymer on 5000 A substrate of thermal oxide of silicon is obtained by spin casting the polymer solution at 3000 rpm. The film is then prebaked at about 120° C for about 1 hour on a hot plate. The film is then exposed in vacuum with a 0.5 $\mu$ diameter electron beam to a dose of $7.1\times10^{-6}$ coulombs/cm$^2$ at 25 kv. The film is developed in hexyl acetate at 35° C for 12 minutes. The exposed region is removed by the solvent yielding a positive image. The net film thickness remaining in the unexposed region is about 58% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in chloroform at 45° C followed by a water rinse and oven drying.

EXAMPLE 6

About a 10 weight % solution of a copolymer of about 92 mole % methyl methacrylate and 8 mole % methyl-$\alpha$-cyano acrylate having $\overline{Mw}$ of about $88\times10^3$ and $\overline{Mn}$ of about $29\times10^3$ and a thermal stability of about 170° C and obtained in accordance with Example E in nitropentane is obtained. A film of about 7940 A of the copolymer on 5000 A substrate of thermal oxide of silicon is obtained by spin casting the copolymer solution at 3000 rpm. The film is then prebaked at about 160° C for about 1 hour on a hot plate. The film is then exposed in vacuum with a 0.5 $\mu$ diameter electron beam to a dose of $9.5\times10^{-6}$ coulombs/cm$^2$ at 25 kv. The film is then developed in dioxane at 50° C for 15 minutes. The exposed region is removed by the solvent yielding a positive image. The net film thickness remaining in the unexposed region is about 71% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in dioxane at 50° C followed by a water rinse and oven drying.

COMPARISON EXAMPLE 7 (PRIOR ART)

About a 10 weight % solution of a polymethyl methacrylate of $\overline{Mw}$ of about $186\times10^3$ and thermal stability of 135° C is obtained. A film of about 9400 A of the polymer on 5000 A substrate of thermal oxide of silicon is obtained by spin casting the polymer solution at 3000 rpm. The film is then prebaked at about 160° C for about 1 hour on a hot plate. The film is then exposed in vacuum with a 0.5 $\mu$ diameter electron beam to a dose of $69\times10^{-6}$ coulombs/cm$^2$ at 25 kv. The film is developed in methyl isobutyl ketone at 20° C for 28 minutes. The exposed region is removed by the solvent yielding a positive image. The net film thickness remaining in the unexposed region is about 75% of the original thickness. The sample is rinsed in chloroform and dried at 110° C for 20 minutes. The 5000 A oxide layer is etched with buffered HF at 21° C to yield 0.5 $\mu$ images for diffusion doping. The film is stripped in 5 minutes in acetone at 40° C followed by a water rinse and oven drying.

A comparison of Examples 1–6 (present invention) with Example 7 (prior art) illustrates the greatly increased sensitivity to electron beam radiation achieved by the present invention. Although comparisons are most accurate when the percents for the unexposed film regions which remain after development are equal, the differences between the percent film remaining in Examples 1–7 are small enough and the magnitude of difference of exposure required by the polymethyl methacrylate as compared to the present invention is so great that the comparison adequately demonstrates the enhanced sensitivity of the present invention. This is particularly true since the relationship of the fraction of film remaining to dosage is substantially linear (i.e., 10% increase in film remaining requires about a 10% increase in dosages. The thickness of the film of unexposed region remaining is measured when all of the exposed film has been removed in the development step and generally should be at least about 50% of the original thickness for a practical process. As seen from the comparison of Examples 1–6 with Example 7, and as experienced by the present inventors, the prior art polymethyl methacrylate generally requires at least about 4 times the dosage or at least 4 times the amount of time of exposure as compared to practicing the present invention. This is particularly important since the time involved in the preparation of, for instance, integrated circuits is primarily dependent upon the amount of time needed for the exposure step. The dosage requirements of Examples 1–6 ranged from 6.5 to $9.5 \times 10^{-6}$ c/cm$^2$ as compared to $69 \times 10^{-6}$ c/cm$^2$ for the prior art polymethyl methacrylate.

What is claimed is:

1. A method for the production of a positive resist image comprising the steps of:
   A. exposing a film consisting essentially of a non-crosslinked polymeric material to electron beam radiation from $10^{-5}$ to about $10^{-6}$ coulombs/cm$^2$ in a predetermined pattern, wherein the non-crosslinked polymeric material has a number average molecular weight (Mn̄) in the range of about $5 \times 10^3$ to about $1,500 \times 10^3$ and a weight average molecular weight (Mw) in the range of about $10 \times 10^3$ to about $300 \times 10^3$; and is selected from the group consisting of:
   1. non-crosslinked polymeric material containing:
      a. polymerized alkyl methacrylate units wherein the alkyl group contains from 1 to 4 carbon atoms; and
      b. polymerized units of at least one other ethylenically unsaturated monomer selected from the group consisting of an acrylic acid derivative containing at least one α-halogen or α-cyano substituent, an acrylate derivative containing at least one α-halogen or α-cyano substituent; acrylonitrile derivative containing at least one α-halogen substituent; vinyl chloride; vinylidene chloride and mixtures thereof and having the formula:

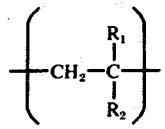

wherein R$_1$ is selected from the group consisting of H, CH$_3$, CN, Cl, CH$_2$Cl, CH$_2$CN, Br, CH$_2$Br, I, CH$_2$I, F and wherein R$_2$ is selected from the group of COOCH$_3$, COOH, CN, CH$_2$CN, Cl, CH$_2$Cl, Br, CH$_2$Br, I, CH$_2$I, F, provided that when R$_2$ is COOCH$_3$ or COOH then R$_1$ is other than CH$_3$ and H; wherein the amount of the polymerized alkyl methacrylate units (a) is from about 50 to about 99 mole % and the amount of the polymerized units of the at least one other ethylenically unsaturated monomer (b) is from about 50 to about 1 mole % based upon the total moles of (a) and (b) in the polymeric material;
   2. posthalogenated polymer of the above polymeric material (1) wherein the halogen content due to the posthalogenation is from about 1 to about 10 mole %, and wherein the total halogen content and cyano content is from about 2 to about 50 mole %;
   3. posthalogenated polyalkyl methacrylate wherein the alkyl group contains from 1 to 4 carbon atoms and wherein the halogen content is between about 1 and about 10 mole %; and
   4. mixtures of any of (1), (2), or (3) with each other;
   B. continuing said exposure until substantial degradation of said polymeric material to lower molecular weight products is achieved in the exposed areas; and
   C. removing the degraded products in the exposed areas.

2. The method of claim 1 wherein said polymeric material consists essentially of a copolymer of said alkyl methacrylate and said acrylic acid derivative.

3. The method of claim 1 wherein said polymeric material consists essentially of a copolymer of said alkyl methacrylate and said acrylate derivative.

4. The method of claim 1 wherein the non-crosslinked polymeric material has a number average molecular weight (Mn̄) in the range of about $20 \times 10^3$ to about $1,000 \times 10^3$ and a weight average molecular weight (Mw̄) in the range of about $40 \times 10^3$ to about $2,000 \times 10^3$.

5. The method of claim 1 wherein said polymeric material consists essentially of a copolymer of said alkyl methacrylate and vinylidene chloride.

6. The method of claim 1 wherein said polymeric material consists essentially of a copolymer of said alkyl methacrylate and of vinyl chloride.

7. The method of claim 1 wherein said polymeric material consists essentially of a copolymer of said alkyl methacrylate and said acrylonitrile derivative containing at least one α halogen substituent.

8. The method of claim 1 wherein said alkyl methacrylate is methyl methacrylate, t-butyl methacrylate or mixtures thereof.

9. The method of claim 1 wherein said alkyl methacrylate is methyl methacrylate.

10. The method of claim 1 wherein at least one other ethylenically unsaturated monomer is selected from the group consisting of methyl-α-cyano acrylate, methyl-α-cyano methyl-acrylate, methyl-α-chloro acrylate, methyl-α-chloro methyl acrylate, α-chloro acrylonitrile, α-chloro acrylic acid, methyl-α-bromo acrylate, methyl-α-bromo methacrylate, vinyl chloride, and vinylidene chloride.

11. The method of claim 1 wherein said polymeric material consists essentially of a copolymer of methyl methacrylate and methyl-α-cyanoacrylate.

12. The method of claim 1 wherein said polymeric material consists essentially of chlorinated polymethyl methacrylate.

13. The method of claim 1 wherein said polymeric material consists essentially of a copolymer of methyl methacrylate and methyl-α-chloroacrylate.

14. The method of claim 1 wherein said polymeric material consists essentially of a copolymer of methyl methacrylate and methyl-α-chloro methyl acrylate.

15. The method of claim 1 wherein said polymeric material consists essentially of a copolymer of methyl methacrylate and methyl-α-bromoacrylate.

* * * * *

UNITED STATES PATENT AND TRADEMARK OFFICE
CERTIFICATE OF CORRECTION

PATENT NO. : 4,011,351
DATED : March 8, 1977
INVENTOR(S) : Edward Gipstein et al It is certified that error appears in the above-identified patent and that said Letters Patent are hereby corrected as shown below:

Column 4, line 56, change "200" to -- 2000 --.

Column 13, line 35, change "(Mw)" to -- ($M\overline{w}$) --.

Signed and Sealed this

*Fourth* Day of *October 1977*

[SEAL]

*Attest:*

RUTH C. MASON
*Attesting Officer*

LUTRELLE F. PARKER
*Acting Commissioner of Patents and Trademarks*